US009006726B2

(12) United States Patent
Capelli et al.

(10) Patent No.: US 9,006,726 B2
(45) Date of Patent: Apr. 14, 2015

(54) ORGANIC LIGHT EMITTING AMBIPOLAR FIELD EFFECT TRANSISTOR WITH DISTRIBUTED LIGHT EMISSION

(71) Applicant: E.T.C. S.R.L., Bologna (IT)

(72) Inventors: Raffaella Capelli, Bologna (IT); Gianluca Generali, Bologna (IT); Michele Muccini, Bologna (IT); Stefano Toffanin, Sant'Angelo di Piove di Sacco (IT)

(73) Assignee: E.T.C. S.R.L., Bologna (BO) (IT)

( * ) Notice: Subject to any disclaimer, the term of this patent is extended or adjusted under 35 U.S.C. 154(b) by 0 days.

(21) Appl. No.: 14/373,225

(22) PCT Filed: Feb. 21, 2013

(86) PCT No.: PCT/IB2013/051400
§ 371 (c)(1),
(2) Date: Jul. 18, 2014

(87) PCT Pub. No.: WO2013/128344
PCT Pub. Date: Sep. 6, 2013

(65) Prior Publication Data
US 2015/0001518 A1    Jan. 1, 2015

(30) Foreign Application Priority Data
Feb. 27, 2012  (IT) .............................. MI2012A0284

(51) Int. Cl.
*H01L 21/00* (2006.01)
*H01L 29/08* (2006.01)
(Continued)

(52) U.S. Cl.
CPC ......... *H01L 51/5296* (2013.01); *H01L 51/0025* (2013.01); *H01L 51/0068* (2013.01);
(Continued)

(58) Field of Classification Search
CPC ............. Y02E 10/549; H01L 51/5012; H01L 51/0541; H01L 51/0545; H01L 51/0558; H01L 51/5092; H01L 51/5088; H01L 51/5296
USPC ................. 438/48, 82, 99; 257/40, 59, 72
See application file for complete search history.

(56) References Cited

U.S. PATENT DOCUMENTS

| 6,970,490 | B2 * | 11/2005 | Holmes et al. ............. 372/43.01 |
| 8,598,448 | B2 * | 12/2013 | Lu et al. ......................... 136/263 |
| 2009/0267061 | A1 * | 10/2009 | Marks et al. ..................... 257/40 |

FOREIGN PATENT DOCUMENTS

| EP | 1609195 | 12/2005 |
| WO | 2004/086526 | 10/2004 |
| WO | 2010/049871 | 5/2010 |

OTHER PUBLICATIONS

Wegweijs, et al. "Charge carrier mobilities in mesomorphic α,ω-dihexylquaterthiophene: A comparative microwave conductivity and thin film transistor study" *Synthetic Metals*, 101, 534-535 (1999).
(Continued)

*Primary Examiner* — Hsien Ming Lee
(74) *Attorney, Agent, or Firm* — Steinfl & Bruno LLP

(57) ABSTRACT

An organic ambipolar light emitting field effect transistor having an architecture with layers stacked one over the other, adapted to generate a diffused illumination is described. The transistor has a gate electrode, a dielectric layer superposed to the gate electrode, an ambipolar channel superposed to the dielectric layer having a P-type semiconductor layer whose energy band is determined by its highest occupied molecular orbital $HOMO\text{-}SC_p$ and lowest unoccupied molecular orbital $LUMO\text{-}SC_p$, a N-type semiconductor layer whose energy band is determined by its highest occupied molecular orbital $HOMO\text{-}SC_n$ and lowest unoccupied molecular orbital $LUMO\text{-}SC_n$ and a light emitting layer adapted to allow recombination of charge carriers of opposite sign, interposed between the P-type semiconductor layer and the N-type semiconductor layer, whose energy band is determined by its highest occupied molecular orbital HOMO-R and lowest unoccupied molecular orbital LUMO-R, respectively; a source electrode adapted to inject charges of a first type and a drain electrode adapted to inject charges of a second type, said source electrode and drain electrode being in contract with a same layer of said P-type or N-type semiconductor layers, the other of said semiconductor layers being in contact with the dielectric layer.

10 Claims, 9 Drawing Sheets

Figure 1A:
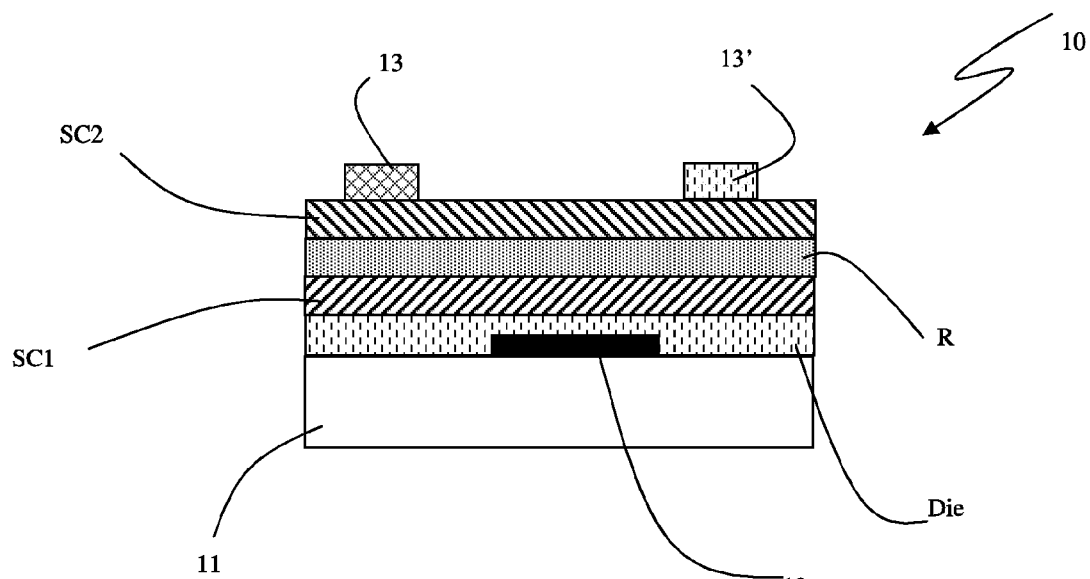

(51) Int. Cl.
*H01L 31/036* (2006.01)
*H01L 51/52* (2006.01)
*H01L 51/50* (2006.01)
*H01L 51/00* (2006.01)

(52) U.S. Cl.
CPC ......... *H01L51/0081* (2013.01); *H01L 51/0087* (2013.01); *H01L 2251/552* (2013.01); *H01L 51/5004* (2013.01); *H01L 51/5024* (2013.01)

(56) References Cited

OTHER PUBLICATIONS

Grecu, S. et al. "Differences of interface and bulk transport properties in polymer field-effect devices" *Organic Electronics* 7(5), 276-286 (2006).

Capelli, R. et al., "Organic light-emitting transistors with an efficiency that outperforms the equivalent light-emitting diodes" *Nature Materials* 9, 496-503 (2010).

Capelli, R. et al., "Integration of silk protein in organic and light-emitting transistors" *Organic Electronics* 12, 1146-1151 (2011).

Namdas, EB., et al., "Organic light emitting complementary inverters" *Applied Physics Letters* 96, 043304 (2010).

Seo, JH., et al., "Solution-Processed organic light-emitting transistors incorporating conjugated polyelectrolytes" *Adv. Funct. Mater.* 21, 3667-3672 (2011).

International Search Report mailed on Jul. 8, 2013 for PCT/IB2013/051400 filed on Feb. 21, 2013 in the name of E.T.C. S.R.L.

Written Opinion mailed on Jul. 8, 2013 for PCT/IB2013/051400 filed on Feb. 21, 2013 in the name of E.T.C. S.R.L.

International Preliminary Report on Patentability mailed on Feb. 6, 2014 for PCT/IB2013/051400 filed on Feb. 21, 2013 in the name of E.T.C. S.R.L.

\* cited by examiner

ORGANIC LIGHT EMITTING AMBIPOLAR FIELD EFFECT TRANSISTOR WITH DISTRIBUTED LIGHT EMISSION

CROSS REFERENCE TO RELATED APPLICATIONS

The present application is the US national stage of International Patent Application PCT/IB2013/051400 filed on Feb. 21, 2013 which, in turn, claims priority to Italian Patent Application MI2012A000284 filed on Feb. 27, 2012.

This invention relates to an organic light emitting field effect transistor with distributed light emission.

In the present description and in the enclosed claims, the term distributed light emission refers to a light emission by a length greater than or equal to 20 μm.

Organic electroluminescent field effect transistors, also known as OLET (Organic Light Emitting Transistor) are a relatively recent type of devices, that have characteristics and potentialities that make them particularly interesting. In particular, compared with the OLED (Organic Light Emitting Diodes), ambipolar OLET have enhanced efficiency and luminosity, and also the possibility of using low cost production processes, once they have been optimized.

Further details about the structure of an ambipolar OLET device may be found in the European patent No EP 1609195 B1; about the potentialities and the functional characteristics of these devices, further details may be found in the article "Organic light-emitting transistors with an efficiency that outperforms the equivalent light-emitting diodes" published in 2010 by Nature Materials, Volume 9, pages 496-503.

So far, all studies and characterizations have shown that these devices have an enhanced luminosity, though concentrated in a confined and very small region inside the ambipolar (meaning that it carries both charge carriers) channel, in which they recombine to each other with consequent emission of luminous radiation. In particular, so far produced ambipolar OLET, such as the ones illustrated in the above mentioned article, have illuminated regions up to 10 μm wide.

This spatially confined emission does not cause problems in a whole class of organic-electronic devices, and it may be an advantage, for example in the field of sensing devices. This use is described for example in the international patent application WO2010049871. Nevertheless, this limits the possible application fields when a large or distributed source of light is needed, such as for example in the field of ambient lighting, of electroluminescent display technology, of the so-called Point of Care biomedical applications, of light sources with high brightness integrated on photonic chips.

Three-layer OLET devices are disclosed in the article by Jung Hwa Seo et al. "Solution-processed organic light-emitting transistors incorporating conjugated polyelectrolytes", Adv. Funct. Mater. 2011, 21, pages 3667-3672, and in the article by Edinazar B. Namdas et al., "Organic light emitting complementary inverters", Applied Physics Letters 96, 043304 (2010). These devices, as highlighted in the same articles, generate a spatially confined illumination and are unsuitable to generate a diffused illumination, and this limits relevantly their possibility of use.

An objective of the present invention is thus to overcome the problems of prior art, making reference to the limited extension of the illuminated region of a field effect transistor, and according to a first aspect it consists in an organic ambipolar light emitting field effect transistor having an architecture with layers stacked one over the other, comprising:
a gate electrode,
a dielectric layer superposed to said gate electrode,
an ambipolar channel superposed to said dielectric layer, comprising a P-type semiconductor layer whose energy band is determined by its highest occupied molecular orbital HOMO-SCp and lowest unoccupied molecular orbital LUMO-SCp, a N-type semiconductor layer whose energy band is determined by its highest occupied molecular orbital HOMO-SCn and lowest unoccupied molecular orbital LUMO-SCn and a light emitting layer adapted to allow recombination of charge carriers of opposite sign, interposed between said P-type semiconductor layer and said N-type semiconductor layer, whose energy band is determined by its highest occupied molecular orbital HOMO-R and lowest unoccupied molecular orbital LUMO-R, respectively;
a source electrode adapted to inject charges of a first type and a drain electrode adapted to inject charges of a second type, said source electrode and drain electrode being in contact with a same layer of said P-type or N-type semiconductor layers, the other of said semiconductor layers being in contact with the dielectric layer.

The novel field effect transistor is capable of generating a distributed light emission because the layers of the ambipolar channel are realized such that
the ratio between the value of the effective field-effect mobility (m2) at the interface between one of said semiconductor layers (SCn; SCp) and said light emitting layer (R) and the value of the effective field-effect mobility (m1) at the interface between the other of said semiconductor layers (SCp; SCn) and said dielectric layer (Die) is in the range from 0.05 to 20;
in the case in which the P-type semiconductor layer (SCp) is in contact with the dielectric layer (Die):
the difference between the levels HOMO-R and HOMO-SCn is comprised between 0.2 eV and 1 eV,
the difference between the levels LUMO-R and LUMO-SCn is comprised between 0.2 eV and 0.8 eV,
the difference between the levels HOMO-R and HOMO-SCp is comprised between 0 eV and 0.5 eV,
the difference between the levels LUMO-R and LUMO-SCp is comprised between −1 eV and 0 eV;
in the case in which the N-type semiconductor layer (SCn) is in contact with the dielectric layer (Die):
the difference between the levels HOMO-R and HOMO-SCn is comprised between 0 eV and 1 eV,
the difference between the levels LUMO-R and LUMO-SCn is comprised between −0.5 eV and 0 eV,
the difference between the levels HOMO-R and HOMO-SCp is comprised between −0.2 eV and −0.8 eV,
the difference between the levels LUMO-R and LUMO-SCp is comprised between −0.2 eV and −1 eV.

In a preferred embodiment, the light emitting layer is a Host-Guest (H-G) system, composed of a Host material and one or more Guest materials, each characterized by an energy band determined by its highest occupied molecular orbital HOMO-H(HOMO-G) and lowest unoccupied molecular orbital LUMO-H (LUMO-G). Using a plurality of Guest materials may be convenient for modifying the spectrum of the light emitted by the device. The novel field effect transistor in which the light emitting layer is a Host-Guest system is capable of generating a distributed light emission because the layers of the ambipolar channel are realized such that:
the ratio between the value of the effective field-effect mobility (m2) at the interface between one of said semiconductor layers (SCn; SCp) and said light emitting layer (R) and the value of the effective field-effect mobility (m1) at the interface between the other of said semiconductor layers (SCp; SCn) and said dielectric layer (Die) is in the range from 0.05 to 20, and in the case in which the P-type semiconductor layer (SCp) is in contact with the dielectric layer (Die):

the difference between the levels HOMO-H and HOMO-SCn is comprised between 0.2 eV and 1 eV, the difference between the levels LUMO-H and LUMO-SCn is comprised between 0.2 eV and 3 eV, the difference between the levels HOMO-H and HOMO-SCp is comprised between 0 eV and 0.5 eV, the difference between the levels LUMO-H and LUMO-SCp is comprised between −1 eV and 3 eV, and for all Guest materials:

the difference between the levels LUMO-G and LUMO-SCn is comprised between 0.3 eV and −1 eV, the difference between the levels HOMO-G and HOMO-His comprised between 0 eV and 1 eV;

in the case in which the N-type semiconductor layer (SCn) is in contact with the dielectric layer (Die):

the difference between the levels HOMO-H and HOMO-SCn is comprised between −3 eV and 1 eV, the difference between the levels LUMO-H and LUMO-SCn is comprised between −0.5 eV and 0 eV, the difference between the levels HOMO-H and HOMO-SCp is comprised between −0.2 eV and −3 eV, the difference between the levels LUMO-H and LUMO-SCp is comprised between −0.2 eV and −1 eV, and for all Guest materials:

the difference between the levels HOMO-G and HOMO-SCp is comprised between −0.3 eV and 1 eV, the difference between the levels LUMO-G and LUMO-His comprised between 0 eV and −1 eV.

According to a preferred embodiment, said ratio between the values of the effective field-effect mobilities m1 and m2, defined hereinabove, is in the range from 0.7 to 1.3.

According to an even more preferred embodiment, in addition to the above conditions, the minimum value of said effective field-effect mobilities m1 and m2 is $10^{-3}$ cm$^2$/Vs.

The claims as filed are integral part of this specification and are herein incorporated by reference.

Figure 1B:
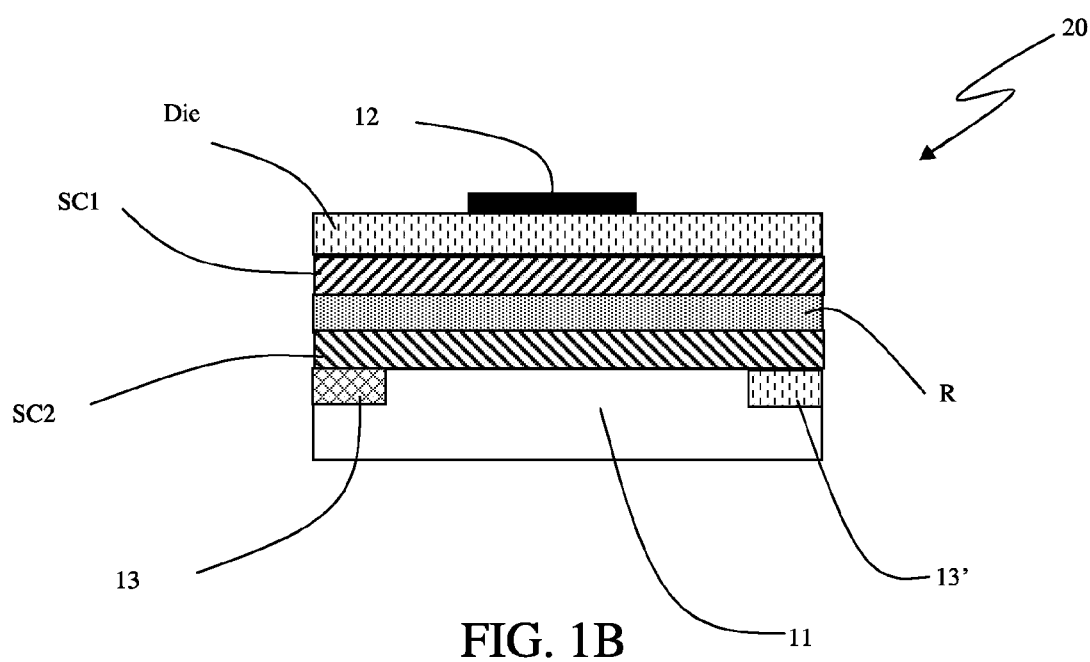
Figure 2A:
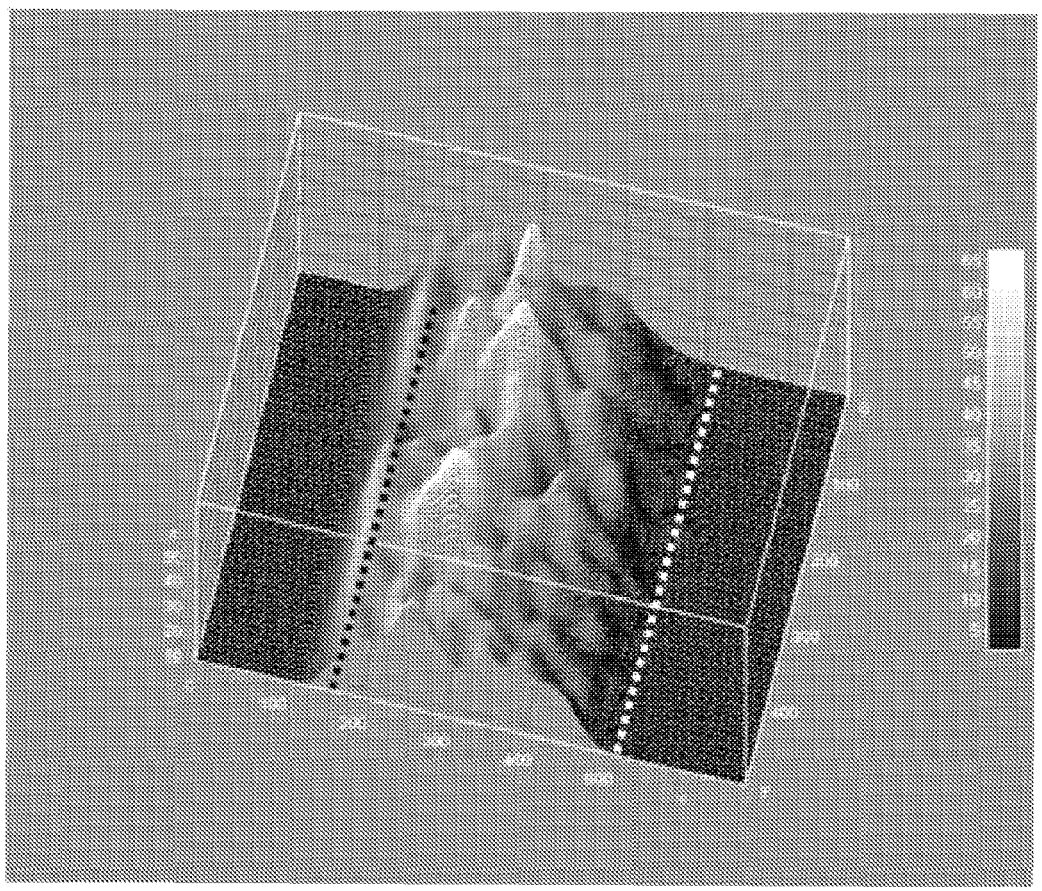
Figure 2B:
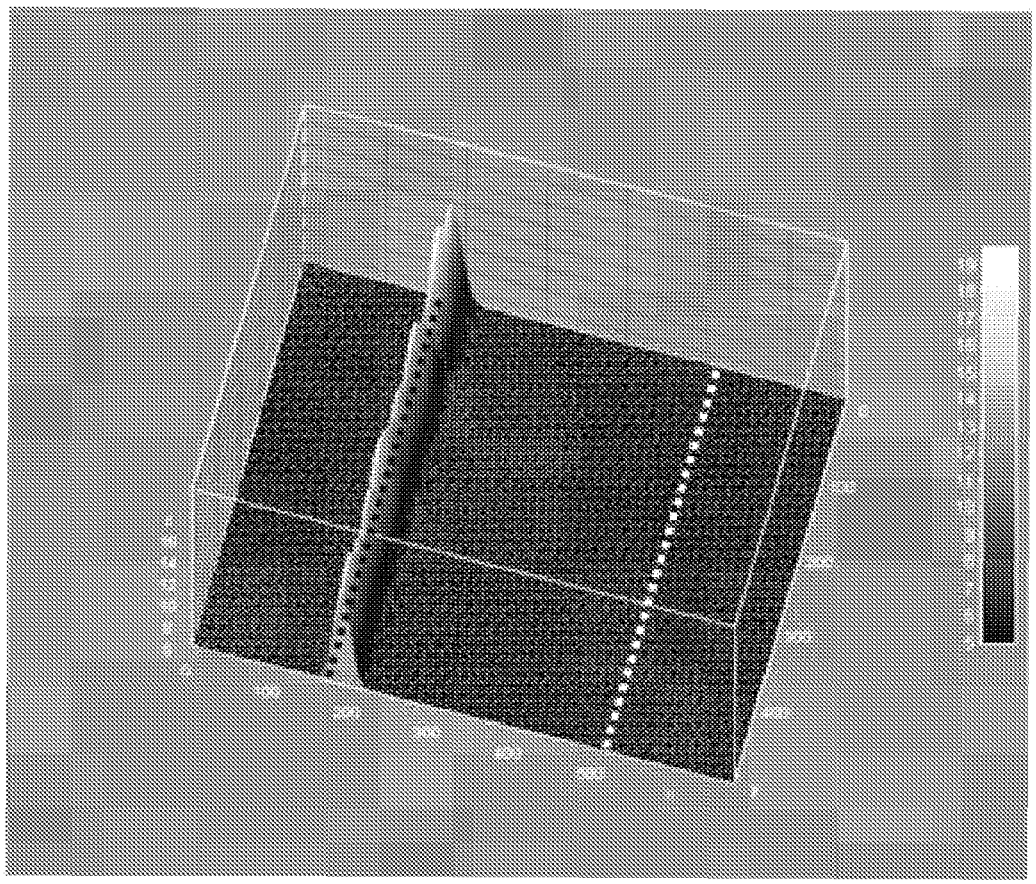
Figure 3:
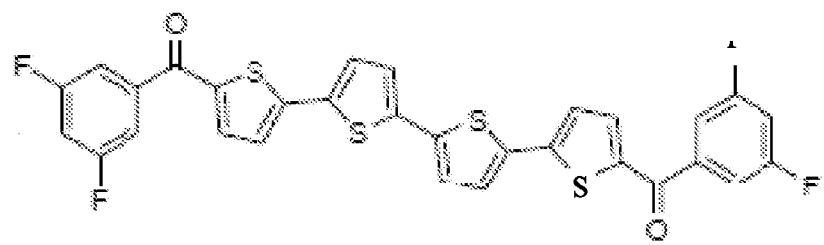
Figure 4A:
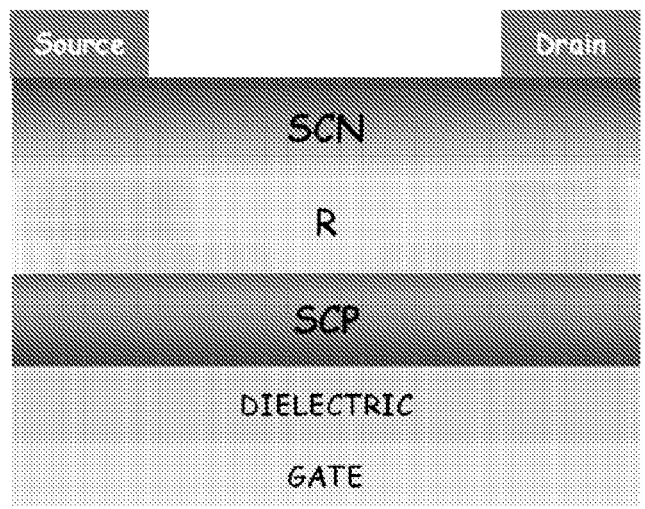
Figure 4B:
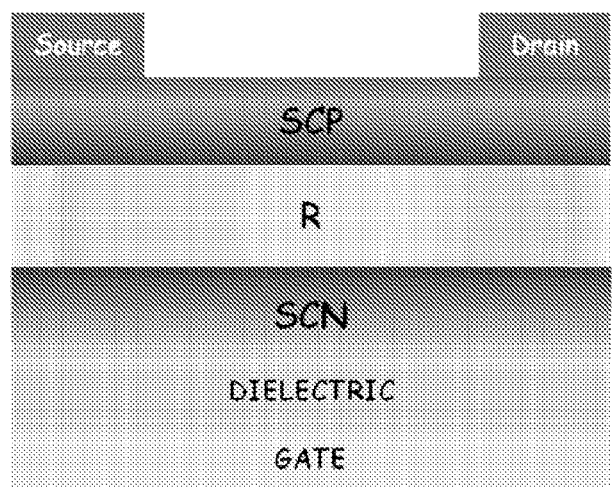
Figure 5:
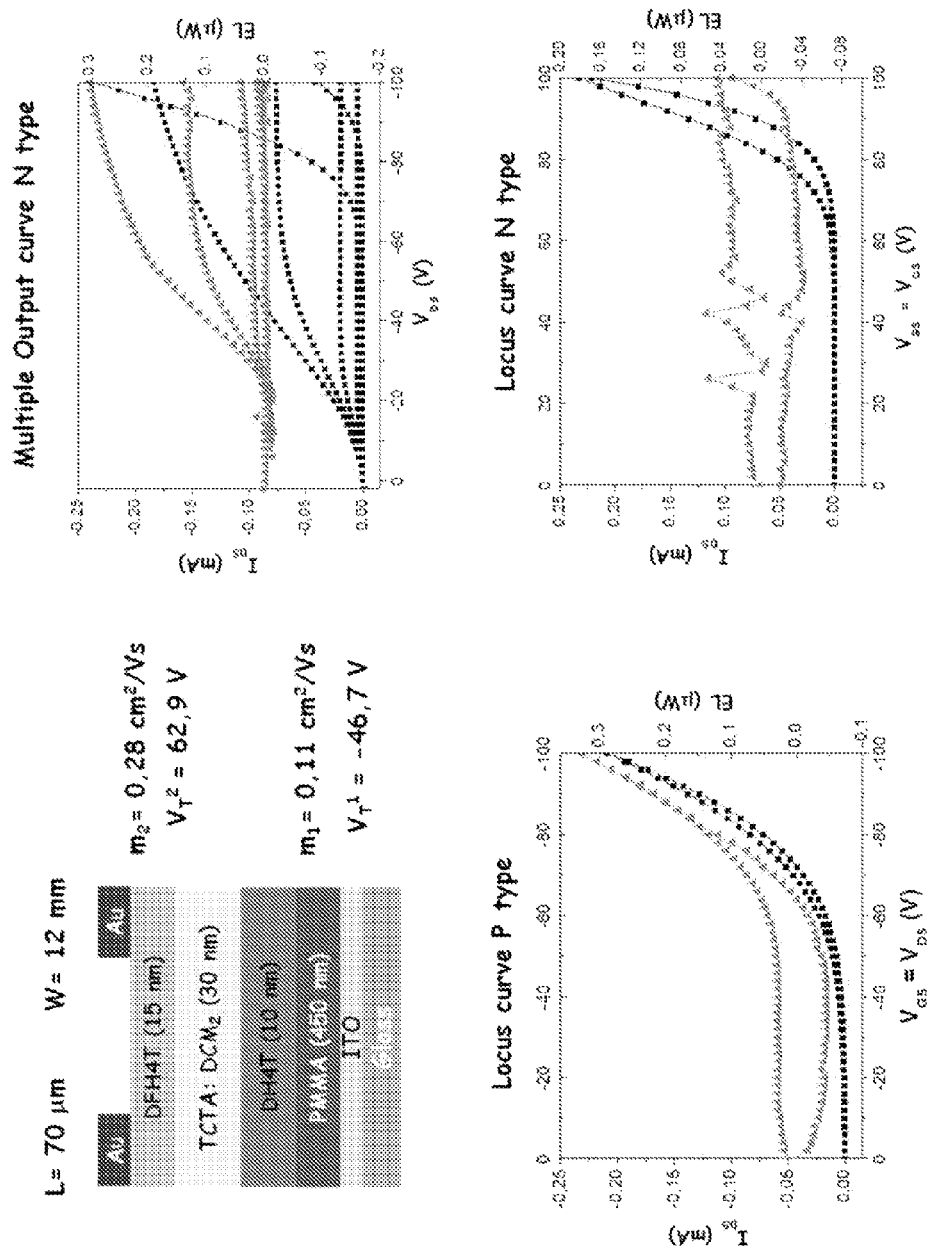
Figure 6:
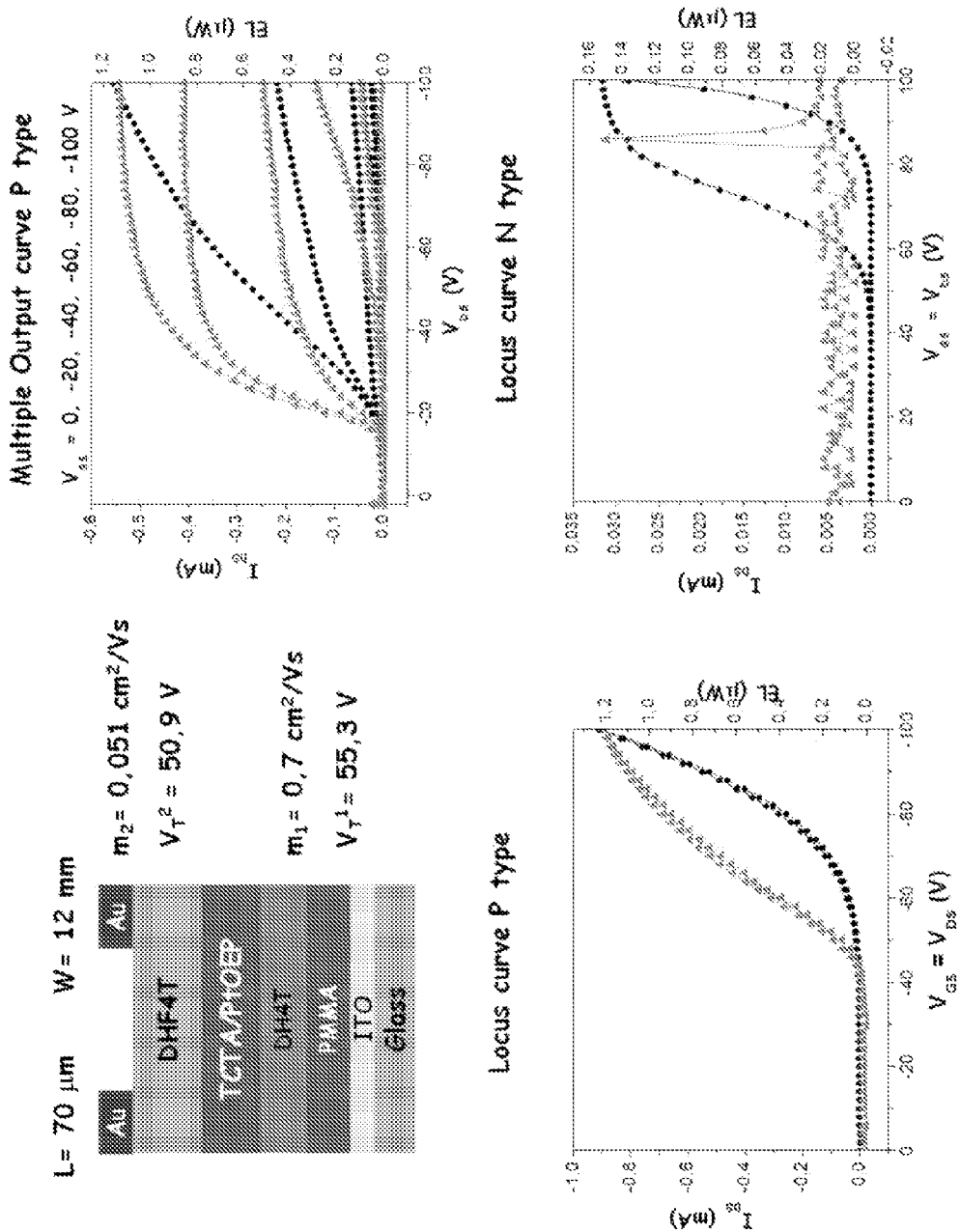
Figure 7:
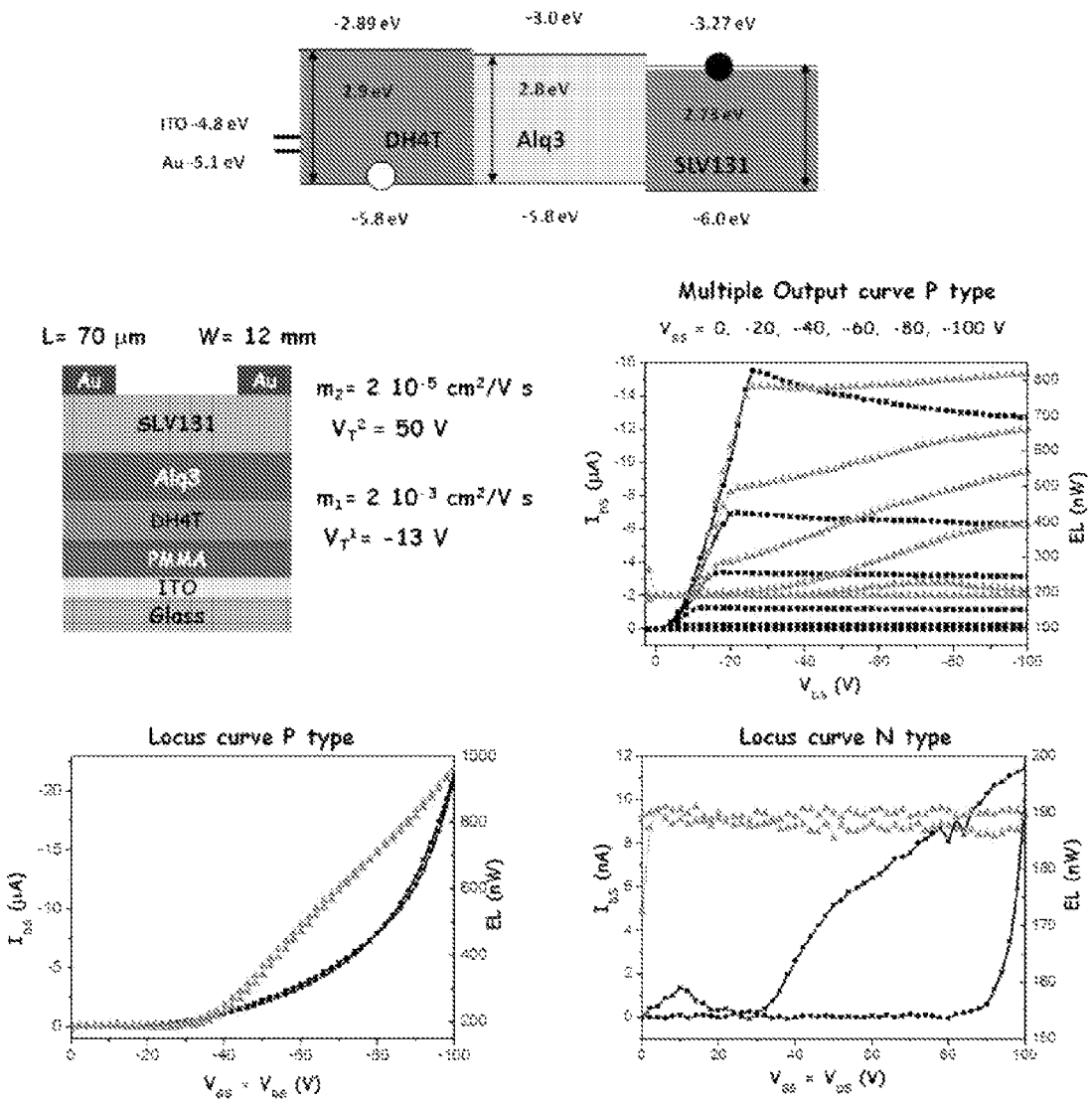

The invention will be illustrated referring to the following figures:

FIGS. 1A and 1B schematically show embodiments of two innovative OLET devices,

FIGS. 2A and 2B show a 3D digital elaboration of the illuminated channel of 2 different OLET devices operated in ambipolar conditions, FIG. 3 shows the chemical structure of the molecular system SLV-131 used for realizing the layer of the N-type semiconductor material used in the comparative example shown in FIG. 7, FIGS. 4A and 4B show other embodiments of an innovative OLET device in which the type of conductivity P and N, respectively, of the SCP and SCN semiconductor layer in contact with the dielectric layer is highlighted, FIG. 5 depicts an architecture of OLET device according to the invention with a P-type semiconductor layer in contact with the dielectric layer, the light emitting layer composed of a Host-Guest system, and the respective graphs of the optoelectronic characteristics, FIG. 6 depicts an architecture of OLET device according to the invention with a P-type semiconductor layer in contact with the dielectric layer, the light emitting layer composed of a Host-Guest system having the same Host material and a Guest material different from the material shown in FIG. 5, and the respective graphs of the optoelectronic characteristics, FIG. 7 shows an architecture of an OLET device not according to this invention with a P-type semiconductor layer (DH4T) in contact with the dielectric layer, a light emitting layer made of tris 8-hydroxyquinolato aluminum (Alq$_3$), an N-type semiconductor layer (SLV131) located above the emitting layer, the energy bands of the used materials and the respective graphs of the optoelectronic characteristics, FIGS. 8A-8D show the LUMO and HOMO levels of possible materials used in the layers of innovative structures of OLET devices with distributed illumination.

Making reference to FIGS. 1A and 1B, it is shown that the ambipolar channel of the transistors according to the invention is composed of a three-layer architecture, wherein the outermost layers SC1, SC2 are made of semiconductor materials, in the light emitting layer R charge carriers of opposite sign recombine with the consequent light emission enabled by the emission properties of the material or materials that constitute this layer.

The inventors have found certain characteristics of an OLET architecture for obtaining, in a reproducible manner, a distributed light emission, that is, as previously defined, a broad (in geometrical sense) light emission spread over at least 20 μm. The advantages tied to the present invention are even more evident in the embodiment of ambipolar OLET devices in which the channel is illuminated along hundreds of microns. Clearly, in these devices the ambipolar channels must be sufficiently wide, that is the ambipolar channels have amplitude wider than or equal to the illuminated area. The amplitude of an ambipolar channel is determined by the distance between the source and drain electrodes of the transistor. An appropriate distance is also determined by the need of avoiding fabricating devices of size greater than what is needed, also taking into account the fact that, in the preferred embodiments of this invention, it is possible to illuminate a significant fraction of the ambipolar channel, typically not smaller than 33% and in certain cases, especially in the case of ambipolar channels smaller than 150 μm, this fraction may also be close to 100% of its amplitude. Moreover, the fact that in wide channels dispersion phenomena and the effect of the difference between the effective mobilities become more relevant, pushes to prefer ambipolar OLET with light distributed emission having a distance between the source and drain electrodes comprised between 20 and 300 μm.

With the term bulk mobility it is intended the intrinsic transport property of a material with reference to a type of charge carriers.

By means of pulse-radiolysis time-resolved microwave conductivity measurements carried out on semiconductor polycrystalline dust at room temperature (for example as disclosed in the scientific article of Wegewijs et al. published by Synthetic Metals, volume 101, pages 534-535) it is possible to obtain values of intrinsic mobility of the material, because there is no effect due to the size of crystalline domains or to the presence of grain edges and the applied electric fields are in the order of 10 V/cm.

The field effect mobility indicates the property of the material of transporting charge carriers during functioning conditions in a field effect device; this value is not tied to the value of the bulk mobility, indeed in this case the mobility is essentially dominated by surface phenomena instead of bulk phenomena and superficial interaction. Merely as an example, the case of poly(3-hexylthiophene) (P3HT) is considered, that has a bulk mobility, measured in a metal-insulator-semiconductor (MIS) diode, equal to $9.3 \times 10^{-7}$ cm$^2$/Vs and field effect mobility in saturation conditions equal to $1.7 \times 10^{-3}$ cm$^2$/Vs (re.: article published by Organic Electronics, volume 7, pages 276-286).

Measures of field effect mobility of the DH4T are obtained from the Locus electrical characteristic ($V_{DS}=V_{GS}$, with $V_{DS}$ that ranges from 0 to −100V) of a single-layer organic field effect transistor (OFET) configured as follows: device substrate made of glass, gate electrode made of a 150 nm layer of ITO, dielectric layer made of a 450 nm layer of PMMA, a semiconductor layer made of a 10 nm layer of DH4T, source and drain electrodes made of a 50 nm layer of gold. The field effect mobility is of about 0.1 cm$^2$/Vs with a threshold voltage of about −25V; on DH4T polycrystalline dust, mobility values of 0.015 cm$^2$/Vs are obtained.

Besides what is stated above, a further level of definition for the mobility of charges is given by the effective field effect mobility, this mobility being the one that is effectively obtained in the considered device under analysis, and may be obtained by its current-potential characteristic. Typically, it is different from the field effect mobility measured in the simplified reference structure, i.e. a field effect transistor (OFET) with a single semiconductor layer.

The value of field effect mobility may be compared with the effective field effect mobility in the considered device obtained by biasing in unipolar transport conditions a three-layer architecture in which, for example, the same layer of material acts as semiconductor SC2 positioned between the gold electrodes and the recombination layer R made of Alq$_3$. For example, in a specific case measured by the inventors, the effective field effect mobility of DH4T is about 0.002 cm$^2$/Vs with a threshold voltage of about −60V.

Tests carried out by the applicant showed that, in order to have an ambipolar transistor with distributed light emission, substantially two conditions must be verified:

1) the ratio between the effective field effect mobilities m1 and m2 for the two different types of charge carriers at the respective interfaces SC1-Die and SC2-R is between 0.05 and 20, 2) in the case in which the light emitting layer is composed of a single material, the differences between the LUMO and HOMO values of the materials of the layers of the ambipolar channel should satisfy the following constraints:

in the case in which the P-type semiconductor layer (SCp) is in contact with the dielectric layer (Die):
the difference between the levels HOMO-R and HOMO-SCn is comprised between 0.2 eV and 1 eV,
the difference between the levels LUMO-R and LUMO-SCn is comprised between 0.2 eV and 0.8 eV,
the difference between the levels HOMO-R and HOMO-SCp is comprised between 0 eV and 0.5 eV,
the difference between the levels LUMO-R and LUMO-SCp is comprised between −1 eV and 0 eV;

in the case in which the N-type semiconductor layer (SCn) is in contact with the dielectric layer (Die):
the difference between the levels HOMO-R and HOMO-SCn is comprised between 0 eV and 1 eV,
the difference between the levels LUMO-R and LUMO-SCn is comprised between −0.5 eV and 0 eV,
the difference between the levels HOMO-R and HOMO-SCp is comprised between −0.2 eV and −0.8 eV,
the difference between the levels LUMO-R and LUMO-SCp is comprised between −0.2 eV and −1 eV;

in the case in which the light emitting layer is a Host-Guest (H-G) system, the differences between the LUMO and HOMO values of the materials of the layers of the ambipolar channel must satisfy the following constrains:

in the case in which the P-type semiconductor layer (SCp) is in contact with the dielectric layer (Die):
the difference between the levels HOMO-H and HOMO-SCn is comprised between 0.2 eV and 1 eV,
the difference between the levels LUMO-H and LUMO-SCn is comprised between 0.2 eV and 3 eV,
the difference between the levels HOMO-H and HOMO-SCp is comprised between 0 eV and 0.5 eV,
the difference between the levels LUMO-H and LUMO-SCp is comprised between −1 eV and 3 eV, and for all Guest materials:
the difference between the levels LUMO-G and LUMO-SCn is comprised between 0.3 eV and −1 eV,
the difference between the levels HOMO-G and HOMO-His comprised between 0 eV and 1 eV;

in the case in which the N-type semiconductor layer (SCn) is in contact with the dielectric layer (Die):
the difference between the levels HOMO-H and HOMO-SCn is comprised between −3 eV and 1 eV,
the difference between the levels LUMO-H and LUMO-SCn is comprised between −0.5 eV and 0 eV,
the difference between the levels HOMO-H and HOMO-SCp is comprised between −0.2 eV and −3 eV,
the difference between the levels LUMO-H and LUMO-SCp is comprised between −0.2 eV and −1 eV, and for all Guest materials:
the difference between the levels HOMO-G and HOMO-SCp is comprised between −0.3 eV and 1 eV,
the difference between the levels LUMO-G and LUMO-His comprised between 0 eV and −1 eV.

The value of effective field effect mobility at the interfaces between the layers of the ambipolar channel is influenced by different factors that allow also to control it. In particular, the mobility of carriers may be increased/reduced by improving/worsening the purity of used materials and by increasing/reducing the size of crystal grains. Moreover, in order to increase the field effect mobility at the interface, conveniently, it is possible to reduce roughness of the surfaces of the layers and to choose materials that do not chemically react when placed in contact one with the other, thus preventing formation at the interface of obstacles to the migration of charge carriers along the interfaces. By adjusting these parameters alone or in combination in an appropriate manner according to well known techniques in the field, a skilled person could adopt a fabrication process of OLET devices such to make the ratio between the effective field effect mobilities m1 and m2 for the two different types of charge at the respective interfaces SC 1-Die and SC2-R be comprised in the above indicated range.

Condition 2) may be verified by properly choosing the materials with which the ambipolar channel is realized. A skilled person will be capable of choosing, among the materials adapted to the fabrication of an OLET device, a P-type semiconducting material for the layer SCp, an N-type semiconducting material for the layer SCn, and one or more materials for the recombination layer R, that satisfy the condition 2).

As a non limiting example, the layer SCp may be made of DH-4T, the layer SCn may be made of DHF-4T and the recombination layer R may be a Host-Guest system made of Alq3-PtOEP or of TCTA-PtOEP or yet of TCTA-DCM2 or yet made only of Alq3, or only of the complex 1,3-di(2-pyridyl)-5-Methyl-benzene platinum(II) chloride. In general, it is possible to choose other materials provided that they may be used in a OLET device and are adapted to satisfy the conditions 1) and 2).

In an embodiment, in order to prevent the effective mobility from being excessively influenced, the roughness at the interfaces between the semiconducting layers SC1 and SC2 and the light emitting layer R is comprised between 0.2 nm and 10 nm. In the present description and in the claims, the measure of the roughness expressed in nanometers, indicates the arithmetic mean value of the deviation of the real profile of the surface from the mean line. Preferably, said roughness at the interfaces is comprised between 0.2 nm and 5 nm.

According to another embodiment, the purity of materials is controlled within certain levels. In this case, excluding the non realizable theoretical case of 100% pure ideal materials, also the purity interval useful for realizing a light emitting transistor with distributed emission should be determined, i.e. to fix the delicate compromise between the industrial feasibility (that may be jeopardized by the need of using materials with a very high purity level) and the use of materials that, not being sufficiently pure, hinder the attainment of the technical effect of the distributed illumination of the channel. In particular, this delicate balancing is satisfied when the purity of materials, that compose the layers of the ambipolar channel of the transistor according to the present invention, ranges between 99.8 and 99.999% and is preferably comprised between 99.99 and 99.999%.

A further consideration should be done about the relationship between the values of the effective mobilities m1 and m2. As stated above, the ratio between the value of the field effect mobility m1 at the interface between said first semiconductor layer SC1 and said dielectric layer Die and the value of the effective field effect mobility m2 at the interface between said second semiconductor layer SC2 and said light emitting layer R ranges between 0.05 and 20. In other words, the ratio between the greatest and the smallest of the values of m1 and m2 is comprised between 20 and 1. This is a very limiting condition, considering that OLET devices may be realized even with values of the effective field effect mobilities m1 and m2 much different from each other; in particular it is possible to obtain OLET devices capable of having a good luminous efficiency even with effective field effect mobilities differing from each other by three orders of magnitude. This could be one of the reasons for which so far an insufficient attention has been paid to the ratio between the values m1 and m2. This condition revealed itself as necessary, in combination with the condition 2), for realizing an organic light emitting transistor with distributed light emission.

A possible architecture of an OLET to which the previous teachings for the realization of an OLET with distributed light emission apply, is shown in FIG. 1.

In this particular embodiment, the light emitting transistor 10 comprises a substrate 11 that acts as a supporting layer, over which there is an electrode 12 that acts as control or gate electrode, and the layer of dielectric material Die, over which there is the first one of the two semiconductor layers SC1 of the ambipolar channel of the transistor. Over the semiconductor layer SC1 there is the light emitting layer R, over which on its turn the second semiconductor layer SC2 is deposited. Over this last layer, there are two electrodes 13 and 13' that act respectively as source and drain of the transistor.

A second alternative to which the teaching of the present invention applies, is shown in FIG. 1B, in this case the OLET structure 20 contemplates the deposition of the source and drain electrodes 13 and 13', that are deposited directly on the substrate 11. These electrodes are in contact with the semiconductor layer SC2, that is surrounded by the light emitting layer R, over which on its turn is deposited the semiconductor layer SC1, surmounted by the dielectric layer Die on which the gate electrode 12 is deposited.

In FIGS. 1A and 1B, the size and dimensional ratios of the various elements are out of scale because they have been altered to facilitate the comprehension of the figure. Moreover, the depicted architectures are merely an example of the type of device that may be realized, because what is relevant for the present invention is the presence of the ambipolar channel comprising the semiconductor layers SC1 and SC2 and the light emitting layer R with the previously described characteristics referring to the effective mobility as its characterizing element. For example, merely as an example, a definitely equivalent variant of the structure shown in FIG. 1A does not use an element 11 as supporting substrate, instead its function is performed by the gate electrode itself, that in this case has an amplitude greater than that depicted in FIG. 1, or the indicated substrate as single element 11 is in reality composed by a plurality of elements.

In general, in an OLET structure the materials that compose the electrodes 13 and 13' may be optimized in function of the type of charge (electrons, holes) that should be injected.

In case of electrodes for the injection of electrons, it is preferred to use calcium, magnesium, aluminum, gold conveniently coated with zinc oxide.

In case of electrodes for injecting holes, it is preferred to use of gold, silver, platinum, copper.

It is also possible to use the same material for realizing both electrodes, in this case only the operating conditions (applied voltages) determine the type of injected charge carriers. This type of structure has, among its advantages, an enhanced versatility of use and the fact of requiring simpler and faster production processes. In this case, particularly suitable materials adapted to the realization of electrodes are for example gold, aluminum, between which gold is preferred.

Among the materials that may be used for realizing the semiconductor layer that carries holes, there are oligoacenes, oligothiophenes and oligofluorenes, pyrimidine derivatives of oligothiophenes, tetrathiophenes substituted in positions α and ω with alkylic chains, the latter being preferred because of the small surface roughness and the great field effect mobility.

Among the materials usable for realizing the semiconductor layer that carries electrons, there are diimide derivatives of perylenes and oligothiophenes, pyrimidine derivatives of oligothiophenes, oligothiophenes with thiazole core, coronene derivatives and derivatives of tetrathiophene substituted in positions α and ω with perfluorated chains, the latter being preferred because of the great field effect mobility.

As far the material of the light emitting layer R is concerned, in which recombination of electrons and holes and the consequent emission of luminous radiation takes place, particularly suitable materials adapted to the realization of the invention are $Alq_3$, cyclometalated platinum complexes of the type 1,3-di(2-pyridyl)-5-Methyl-benzene platinum(II) chloride, or Host-Guest systems with quinoline Aluminum lattice doped in various manners with, for example, 4-(dicyanomethylen)-2-methyl-6-(p-dimethylaminostyryl)-4H-pyrane, Platinum octaethyl-porphyryn, phenylisoquinoline of Iridium acetylacetonate, or Host-Guest systems with Aluminum quinoline lattice doped with a combination of these molecules.

The invention is better described hereinafter through a non limiting example of an embodiment (Example 1). Counter-examples are also provided in which the light emission is spatially confined (Example 2, Example 3 and Example 4) because both the above conditions 1 and 2 are not verified at the same time.

Example 1

An organic ambipolar light emitting field effect transistor with distributed light emission is realized from a substrate that comprises a first layer of glass on which there is a layer of ITO (Indium Tin Oxide), on which there is a layer of polymethylmethacrylate (PMMA) as dielectric Die. The first layer of semiconductor material SC 1 is deposited over the layer of PMMA, in this case a layer of 15 nm made of dihexyltetrathiophene (DH4T) as layer for carrying holes. In contact with this layer there is a 40 nm layer of light emitting material, composed of a Host-Guest mixture of tris 8-hydroxyquinolato aluminum ($Alq_3$) containing 8% by weight of platinum octaethyl-porphyrin (PtOEP), and finally the last element of the three-layer stack, the semiconductor SC2 for carrying electrons, made of di-perfluoro-hexyl-tetrathiophene (DHF4T), having a thickness of 20 nm. On this last stage there are two gold electrodes having a thickness of 50 nm and spaced apart one from the other by 70 μm. The stack of the three layers, DH4T, $Alq_3$+PtOEP and DHF4T constitutes the ambipolar channel of the transistor.

The process for growing the structure has been optimized using techniques that are widespread in the field and well known to the skilled person, for not affecting the field effect mobility of the charge carriers, in particular the growing speed of the two layers of DH4T and DHF4T was controlled and set to 0.15 Angstrom/s, the growing speed of the layer of $Alq_3$ was been set to 5 Angstrom/s. Moreover, the insertion of PtOEP in $Alq_3$ took place through controlled co-deposition of this last element at the desired percentage (8%).

As far as the purity of the materials is concerned, DH4T was subjected to two re-crystallization processes, and the DHF4T was subjected to two sublimation processes at temperature with controlled gradient. The implemented processes have reduced impurities in the interval 0.02-0.001% for both materials; $Alq_3$ is pure at 99.99%.

In this specific example, the degree of purity of materials ensures that the effective field effect mobilities of both carries are sufficiently close to each other for having a wide illumination of the channel, using materials and related purification processes that allow the realization of devices on an industrial scale.

In particular, in order to measure the effective field effect mobility, the transistor is operated in unipolar mode. With this device a mobility for the negative charges m2=0.2 $cm^2/Vs$ and a mobility for the positive charges m1=0.28 $cm^2/Vs$, with threshold voltages equal to $V_T^N$=50V and $V_T^P$=−60V, respectively, were obtained.

Figure 8A:
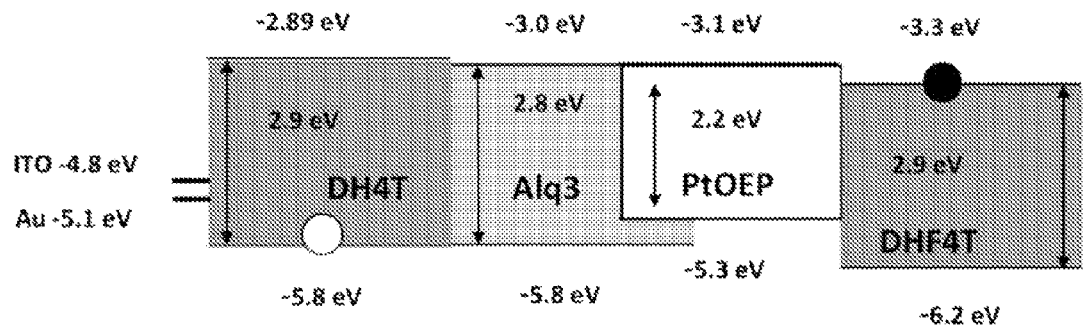
Figure 8B:
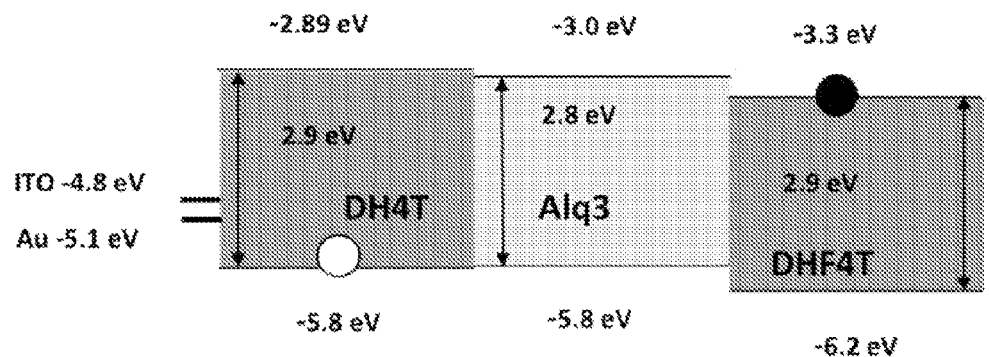

As far as the condition 2) is concerned, that is about the different constraints on the values of the energy levels, they are all verified, as it is possible to infer from the scheme depicted in FIG. 8A.

The transistor realized as in the example 1 is operated in an ambipolar functioning condition, by setting a potential difference between gate and source Vgs of −60V, and a potential difference between drain and source Vds of −100V and its light emission is collected through a Nikon Eclipse 2000-E microscope with 60× magnification and 0.7 numerical aperture.

The obtained results are shown in the 3D digital elaboration of the emission in the channel of the transistor (FIG. 2A). In this example, as well as in the following Example 3, the digital elaboration of the acquired image has been converted in a black and white format for making it more readable.

Example 2

Comparative

An organic ambipolar light emitting field effect transistor is realized exactly with the same materials, the same structure and the same thicknesses used in the Example 1.Nevertheless, in this example, the growth rate in the two layers of DH4T and DFH4T was controlled and set to 0.1 Angstrom/s, and the growth rate for the $Alq_3$ layer was set to 2 Angstrom/s. All the other characteristics of the device, including the insertion of PtOEP in $Alq_3$ performed through controlled co-deposition in the percentage of 8%, remain unchanged. The overall structure of the device is thus ITO/PMMA/DH4T (15 nm, 0.1 A/s)/$Alq_3$:PtOEP 8% (40 nm, 2 A/s)/DHF4T (20 nm, 0.1 A/s)/Au (50 nm). The fact of having modified the growth rate of the organic layers, caused the effective mobilities to become m2=0.006 $cm^2V/s$ for negative charges and m1=0.38 $cm^2V/s$ for positive charges, with threshold voltages equal to $V_T^N$=30V and $V_T^P$=−57V, respectively. Given that condition 1) the ratio between the values of the effective mobilities is not complied with, the emission of the ambipolar light emitting transistor is spatially confined. Therefore the condition on the effective mobility is a cardinal element in order to achieve a distributed light emission as comparative example 2 clearly shows. Such condition was not disclosed or described in the already referenced 2010 Nature Materials paper "Organic light-emitting transistors with an efficiency that outperforms the equivalent light-emitting diodes", that shows OLET with narrow and well defined light spatial emission without no teaching or suggestion on how to alter or achieve a distributed light emission.

Example 3

Comparative

Differently from the above discussed examples, an OLET architecture, the scheme of which is depicted in FIG. 7, in which a layer of semiconductor material DH4T (30 nm thickness) with P-type mobility is deposited on the PMMA dielectric. Over the semiconductor SC1 is deposited a layer of $Alq_3$ having a thickness of 30 nm, that acts as light emitting layer. The layer SC2 with N-type mobility in contact with the gold electrodes is composed of a layer having a thickness of 30 nm of an arylcarbonylic derivative of tetrathiophene (SLV-131), having the empirical formula $C_{30}H_{14}O_2S_4F_4$ and having the molecular structure depicted in FIG. 3.

The architecture of FIG. 7 shows that the condition 2) about energy levels is complied with, though the structure of this example is characterized by a ratio of two orders of magnitude between the effective field effect mobility values at the respective interfaces of SC1 and of SC2. The fact of not having satisfied even only the condition 1), caused a reduction of the amplitude of the light emitting area to about 10 μm, as demonstrated in FIG. 2B in which a 3D digital elaboration of the illuminated channel, in an ambipolar functioning condition, is depicted.

Example 4

Comparative

An organic ambipolar light emitting field effect transistor is realized starting from a substrate that comprises a first layer of glass over which there is a layer of ITO (Indium Tin Oxide), over which there is a layer of polymethylmethacrylate (PMMA) that acts as dielectric Die. The first layer of semiconductor material SC 1 is deposited on the layer of PMMA, in this case a 10 nm layer made of di-hexyl-tetrathiophene (DH4T) as layer for carrying holes. In contact with this layer there is a 40 nm layer of light emitting material made of Tris(4-carbazoyl-9-ylphenyl)amine (TCTA), and the topmost element of the three-layer stack, the semiconductor SC2 for transporting electrons, made of di-perfluoro-hexyl-tetrathiophene (DHF4T), having a thickness of 15 nm. Over this last layer there are the two gold electrodes having a thickness of 50 nm and spaced apart one from the other by 70 microns. The stack of the three layers DH4T, TCTA and DHF4T constitutes the ambipolar channel of the transistor.

The process for growing the structure has been optimized by using techniques that are widespread in the field and well known to the skilled persons for not affecting the field effect mobility of the charge carriers, in particular the growing rate of the two layers of DH4T and DFH4T was controlled and set to 0.1 Angstrom/s, the growing rate of the layer of TCTA was set to 5 Angstrom/s. With this device, a mobility for the negative carriers m2=0.22 cm$^2$V/s and a mobility for the positive carriers m1=0.085 cm$^2$V/s, with threshold voltages equal to $V_T^N$=69V and $V_T^P$=−32V, respectively, were obtained.

The condition 1) about the ratio between the values of the effective mobilities was satisfied. Nevertheless, the energy levels of the levels HOMO and LUMO of the used materials are not complying with condition 2) and the emission of the light emitting ambipolar transistor is spatially confined. Indeed, as it may be inferred from FIGS. 8C and 8D, the conditions about the energy differences between LUMO-R and LUMO-SCn, that is 0.9 eV, thus out of the requested range [from 0.2 eV to 0.8 eV], is not satisfied.

FIGS. 4A and 4B depict possible architectures of an OLET device in which the layer in contact with the dielectric is respectively of P-type (SCP) or of N-type (SCN).

Example 5

Figure 8C:
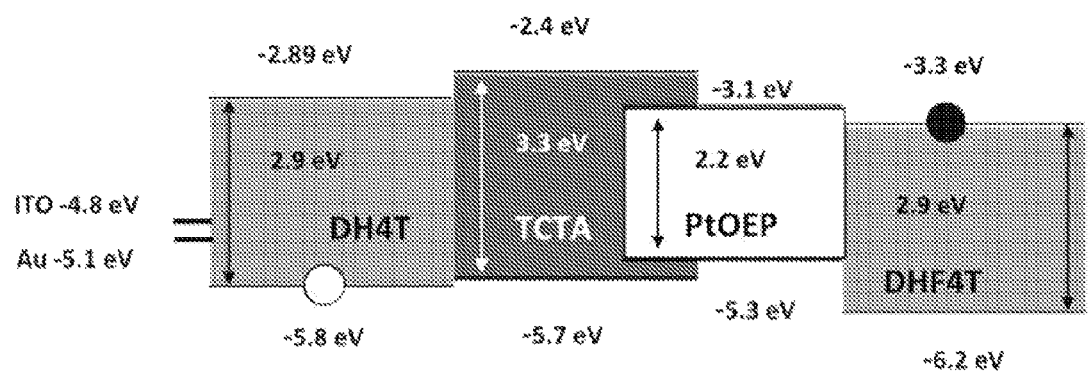
Figure 8D:
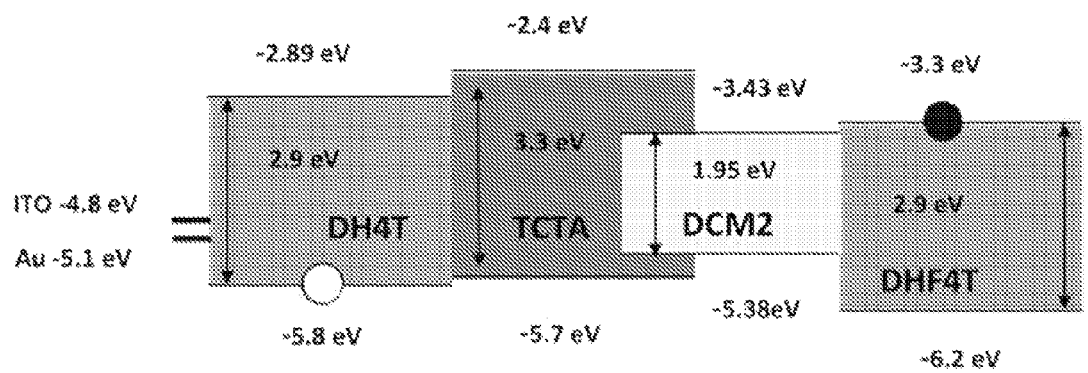

FIG. 5 shows an example of architecture of an OLET device with distributed illumination, experimentally tested, and the related graphs of the voltage-current and voltage-emission characteristics obtained with the described architectural features. The recombination layer in this case is composed of TCTA:DCM2. It is to be noticed that the effective mobilities differ between them by less than 20 times, i.e. the ratio of the maximum value, 0.28 cm$^2$/Vs for the negative carriers, with the minimum value of 0.11 cm$^2$/Vs for the positive carriers, is 2.54 cm$^2$/Vs, well within the limit value of 20 as imposed by condition 1). Also condition 2) is complied as shown in FIG. 8D.

Example 6

FIG. 6 is similar to FIG. 5 and shows another exemplary architecture of an OLET device with distributed illumination and the related graphs of the voltage-current and voltage-emission characteristics. In this case, the recombination layer is composed of TCTA-PtOEP. With regards the compliance with the condition on the effective mobilities, the effective mobile of the negative carriers is the lowest one, 0.051 cm$^2$/Vs, while the effective mobility of the positive carriers is 0.7 cm$^2$/Vs, resulting in a ratio of 13.7. Also condition 2) is complied as shown in FIG. 8C.

Example 7

Comparative

FIG. 7 shows an architecture of an OLET device not according to this invention with a P-type semiconductor layer (DH4T) in contact with the dielectric, a light emitting layer made of tris 8-hydroxyquinolato aluminum (Alq$_3$), a N-type semiconductor layer (SLV131) placed on the light emitting layer. As it is possible to see, the HOMO and LUMO levels of the used materials are compliant with the above mentioned condition 2). The inventors have experimentally verified that condition 1) about the ratio between the effective mobilities at the interfaces is not satisfied. The positive carrier effective mobility is 2*10$^{-3}$ cm$^2$/Vs, the negative carrier effective mobility is 2*10$^{-5}$ cm$^2$/Vs, resulting in a ratio between them of 100, therefore outside the condition on the effective mobility ratio.

The OLET device of FIG. 7 has therefore a spatially confined illumination.

Figures from 8A to 8D illustrate the LUMO and HOMO levels of materials usable for realizing the novel device, together with the Fermi level of the source and drain contacts. As it may be easily inferred, with these materials the condition 2) is satisfied thus they are suitable for realizing the novel OLET device with distributed illumination, provided that they are deposited in a way to make the effective field effect mobilities at the interfaces not differing from each other by more than 20 times.

The invention claimed is:

1. An electroluminescent ambipolar organic field-effect transistor, having an architecture with stacked layers, comprising:
   a gate electrode,
   a dielectric layer superposed to said gate electrode,
   an ambipolar channel superposed to said dielectric layer, comprising
   a P-type semiconductor layer whose energy band is determined by its highest occupied molecular orbital HOMO-SCp and lowest unoccupied molecular orbital LUMO-SCp,
   an N-type semiconductor layer (SCn) whose energy band is determined by its highest occupied molecular orbital HOMO-SCn and lowest unoccupied molecular orbital LUMO-SCn, and
   a light emitting layer adapted to allow recombination of charge carriers of opposite sign, interposed between said P-type semiconductor layer and said N-type semiconductor layer, said light emitting layer being alternatively composed of either a single material whose energy band is determined by its highest occupied molecular orbital HOMO-R and lowest unoccupied molecular orbital LUMO-R, or a Host-Guest system composed of a Host material and one or more Guest materials, the Host material having an energy band determined by its highest occupied molecular orbital HOMO-H and lowest unoccupied molecular orbital LUMO-H and the one or more Guest materials having each an energy band determined by respective highest occupied molecular orbital HOMO-G and lowest unoccupied molecular orbital LUMO-G,
   a source electrode adapted to inject charges of a first type and
a drain electrode adapted to inject charges of a second type, said source electrode and drain electrode being in contact with a top layer of said P-type or N-type semiconductor layers, a bottom layer of said P-type or N-type semiconductor layers being in contact with the dielectric layer, wherein
   a ratio between a value of an effective field-effect mobility at an interface between the top layer of said P-type or N-type semiconductor layers and said light emitting layer and a value of an effective field-effect mobility at an interface between the bottom layer of said P-type or N-type semiconductor layers and said dielectric layer is in the range from 0.05 to 20;

in the case in which the P-type semiconductor layer is in contact with the dielectric layer and said light emitting layer is composed of a single material:
the difference between the levels HOMO-R and HOMO-SCn is comprised between 0.2 eV and 1 eV,
the difference between the levels LUMO-R and LUMO-SCn is comprised between 0.2 eV and 0.8 eV,
the difference between the levels HOMO-R and HOMO-SCp is comprised between 0 eV and 0.5 eV,
the difference between the levels LUMO-R and LUMO-SCp is comprised between −1 eV and 0 eV;
in the case in which the N-type semiconductor layer is in contact with the dielectric layer and said light emitting layer is composed of a single material:
the difference between the levels HOMO-R and HOMO -SCn is comprised between 0 eV and 1 eV,
the difference between the levels LUMO-R and LUMO-SCn is comprised between −0.5 eV and 0 eV,
the difference between the levels HOMO-R and HOMO-SCp is comprised between −0.2 eV and −0.8 eV,
the difference between the levels LUMO-R and LUMO-SCp is comprised between −0.2 eV and −1 eV;
in the case in which the P-type semiconductor layer is in contact with the dielectric layer and said light emitting layer is composed of a Host-Guest system:
the difference between the levels HOMO-H and HOMO-SCn is comprised between 0.2 eV and 1 eV,
the difference between the levels LUMO-H and LUMO-SCn is comprised between 0.2 eV and 3 eV,
the difference between the levels HOMO-H and HOMO-SCp is comprised between 0 eV and 0.5 eV,
the difference between the levels LUMO-H and LUMO-SCp is comprised between −1 eV and 3 eV, and
for all Guest materials:
the difference between the levels LUMO-G and LUMO-SCn is comprised between 0.3 eV and −1 eV,
the difference between the levels HOMO-G and HOMO-H is comprised between 0 eV and 1 eV;
in the case in which the N-type semiconductor layer is in contact with the dielectric layer and said light emitting layer is composed of a Host-Guest system:
the difference between the levels HOMO-H and HOMO-SCn is comprised between −3 eV and 1 eV,
the difference between the levels LUMO-H and LUMO-SCn is comprised between −0.5 eV and 0 eV,
the difference between the levels HOMO-H and HOMO-SCp is comprised between −0.2 eV and −3 eV,
the difference between the levels LUMO-H and LUMO-SCp is comprised between −0.2 eV and −1 eV, and for all Guest materials:
the difference between the levels HOMO-G and HOMO-SCp is comprised between −0.3 eV and 1 eV, and
the difference between the levels LUMO-G and LUMO-H is comprised between 0 eV and −1 eV.

2. The transistor according to claim 1, wherein said ratio is in the range from 0.7 to 1.3.

3. The transistor according to claim 1, wherein the value of said effective field effect mobility at the interface between the top layer of said P-type or N-type semiconductor layers and said light emitting layer and the value of the effective field-effect mobility at the interface between the bottom layer of said P-type or N-type semiconductor layers and said dielectric layer are at least $10^{-3}$ cm$^2$/Vs.

4. The transistor according to claim 1, wherein a distance between said source electrode and drain electrode is between 20 µm and 300 µm.

5. The transistor according to claim 1, wherein a surface roughness at the interfaces between said light emitting layer and each of the P-type or N-type semiconductor layers is in the range from 0.2 nm to 10 nm.

6. The transistor according to claim 5, wherein said surface roughness is in the range from 0.2 nm to 5 nm.

7. The transistor according to claim 1, wherein the materials forming said ambipolar channel have a purity between 99.8% and 99.999%.

8. The transistor according to claim 7, wherein said purity is between 99.99% and 99.999%.

9. The transistor according to claim 1, wherein said source electrode and rain electrode are made of a same material.

10. The transistor according to claim 1, wherein in the case in which the P-type semiconductor layer is in contact with the dielectric layer and said light emitting layer is composed of a single material:
the difference between the levels LUMO-R and LUMO-SCn is comprised between 0.2 eV and 0.6 eV,
the difference between the levels HOMO-R and HOMO-SCp is comprised between 0.2 eV and 0.5 eV, and
the difference between the levels LUMO-R and LUMO-SCp is comprised between −1 eV and −0.2 eV;
in the case in which the N-type semiconductor layer is in contact with the dielectric layer and said light emitting layer is composed of a single material:
the difference between the levels HOMO-R and HOMO-SCn is comprised between 0.2 eV and 1 eV,
the difference between the levels LUMO-R and LUMO-SCn is comprised between −0.5 eV and −0.2 eV, and the difference between the levels HOMO-R and HOMO-SCp is comprised between −0.2 eV and −0.6 eV.

* * * * *